United States Patent
Ishihara

[19]

[11] Patent Number: 6,145,087
[45] Date of Patent: Nov. 7, 2000

[54] SEMICONDUCTOR INTEGRATED DEVICE

[75] Inventor: Akihiro Ishihara, Tokyo, Japan

[73] Assignee: Oki Electric Industry Co., Ltd., Tokyo, Japan

[21] Appl. No.: 09/389,595

[22] Filed: Sep. 3, 1999

[30] Foreign Application Priority Data

Sep. 7, 1998 [JP] Japan ................................ 10-252487

[51] Int. Cl.$^7$ ................................................ G01R 31/28
[52] U.S. Cl. ............................ 713/500; 714/30; 714/724; 395/500.05
[58] Field of Search ........................... 713/500; 702/108, 702/117, 120; 714/30, 37, 724, 731, 733–735; 395/500.05–500.07, 500.18, 500.19

[56] References Cited

U.S. PATENT DOCUMENTS

| | | | |
|---|---|---|---|
| 4,914,379 | 4/1990 | Maeno | 714/731 |
| 5,084,874 | 1/1992 | Whestel, Jr. | 714/727 |
| 5,430,735 | 7/1995 | Saverwald et al. | 714/731 |
| 5,497,378 | 3/1996 | Amini et al. | 714/727 |
| 5,546,406 | 8/1996 | Gillenwater et al. | 714/733 |
| 6,006,347 | 12/1999 | Churchill et al. | 714/724 |

*Primary Examiner*—Thomas M. Heckler
*Attorney, Agent, or Firm*—Jones Volentine, LLC

[57] ABSTRACT

At the beginning of a test, a selector 22 selects and outputs a test clock CLKt provided by an LSI tester in conformance to a select signal SL. In response, test data are stored in an input data register 24 in synchronization with the clock CLKt. If the logic level of the select signal SL is changed after the test data are stored, the selector 22 selects an internal clock CLK generated by an internal oscillation circuit 21 and a core logic unit 23 generates output data through an operation performed in synchronization with the clock CLK. These output data are stored in an output data register 25. If the logic level of the select signal SL is changed after the output data are stored, the stored output data are output in synchronization with the clock CLKt.

4 Claims, 8 Drawing Sheets

SEMICONDUCTOR INTEGRATED DEVICE

BACKGROUND OF THE INVENTION

The present invention relates to a semiconductor integrated device (hereafter referred to as an LSI) and more specifically, it relates to a semiconductor integrated device formed at a single LSI chip, which enables testing performed by using a test pattern with an LSI tester.

FIG. 2 is a block diagram of an LSI chip in the prior art.

This LSI chip 10 is provided with an internal oscillation circuit 11 that supplies an internal clock CLK to the inside of the chip, a selector 12 that, with the clock CLK and a test clock CLKt supplied from the outside input thereto, selects either the clock CLK or the clock CLKt in based upon a select signal SL input through a select terminal Ts and a core logic unit 13 that is connected between an input terminal IN and an output terminal OUT. The core logic unit 13 takes in data provided through the input terminal IN in synchronization with the clock that has been selected by the selector 12, processes the data, and outputs the data resulting from the processing. as output data to the output terminal OUT.

An LSI tester is utilized to conduct tests using a test pattern on the LSI chip 10 described above.

The LSI tester provides the test pattern as input data to the chip 10 via the input terminal IN and also provides the selector 12 with the test clock CLKt via a clock terminal Tc. For this process, the select signal SL is set at a logic level that causes the selector 12 to select the test clock CLKt so that the test clock CLKt is provided to the core logic unit 13. The core logic unit 13 takes in and processes the test pattern provided through the input terminal IN in synchronization with the test clock CLKt, and outputs the results of the processing to the output terminal OUT.

However, the LSI chip 10 in the prior art illustrated in FIG. 2 has the following problems.

Since the operation of the core logic unit 13 during a test, which is performed in synchronization with the test clock CLKt is subject to the restrictions imposed by the maximum frequency of the test clock CLKt generated by the LSI tester, the test cannot be conducted at higher speed.

In addition, if the frequency of the internal clock CLK output by the internal oscillation circuit 11 and the frequency of the test clock CLKt are different, the evaluation cannot be made on operations performed by the core logic unit 13 on the internal clock CLK, since the LSI is not provided with any means for achieving adjustment of the difference.

SUMMARY OF THE INVENTION

In order to address the problems of the prior art discussed above, in a first aspect of the present invention, an LSI comprising an internal oscillation circuit that generates an internal clock through oscillation, a selector that selects and outputs either a test clock provided from the outside or the internal clock in conformance to a select signal and a core logic unit that takes in input data input through an input terminal in synchronization with the test clock or the internal clock provided by the selector, performs processing on the input data and outputs the output data resulting from the processing to an output terminal, is further provided with an input data register and an output data register described below.

The input data register, which is connected between the input terminal and the core logic unit, stores test data provided through the input terminal as the input data in synchronization with the test clock output by the selector during an initial first period elapsing after a test mode is set. The output data register, which is connected between the core logic unit and the output terrinal, stores the output data output by the core logic unit in synchronization with the internal clock output by the selector during a second period following the first period and provides the stored output data to the output terminal in synchronization with the test clock output by the selector during a third period elapsing after the second period is completed.

By adopting this structure, the test data are stored in the input data register in synchronization with the test clock during the first period. During the second period, the test data that have been stored in the input data register are taken into the core logic unit in synchronization with the internal clock and are processed in synchronization with the internal clock. The output data generated as a result of the processing are stored in the output data register. The output data stored in the output data register are provided to the output terminal in synchronization with the test clock during the third period.

In a second aspect and a third aspect of the present invention, a counter that counts the number of clock pulses in the internal clock or the test clock output by the selector and generates a select signal whose polarity changes each time the count reaches a specific value is provided in the LSI in the first aspect of the invention.

By employing this structure, in which the polarity of the select signal changes automatically, the selection made by the selector changes automatically as well.

In a fourth aspect of the present invention, the input data register and the output data register in the LSI in the first aspect each output a pulse when a specific number of sets of data have been input thereto. In addition, in the fourth aspect, a means for select signal generation is provided, which generates a select signal that causes the selector to select the test clock during an initial, first period elapsing after a test mode is set, causes the selector to select the internal clock in conformance to the pulse output by the input data register when the specific number of sets of test data have been input to the input data register and causes the selector to select the test clock in conformance to the pulse output by the output data register when the specific number of sets of output data have been input to the output data register.

In this structure, when the specific number of sets of test data have been input to the input data register via the input terminal, the selection made by the selector is switched to cause the core logic unit to engage in an operation in synchronization with the internal clock, and when the specific number of sets of output data have been stored in the output data register, the selection made by the selector is switched to cause the output data register to output the output data in synchronization with the test clock.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

First Embodiment

Figure 1:
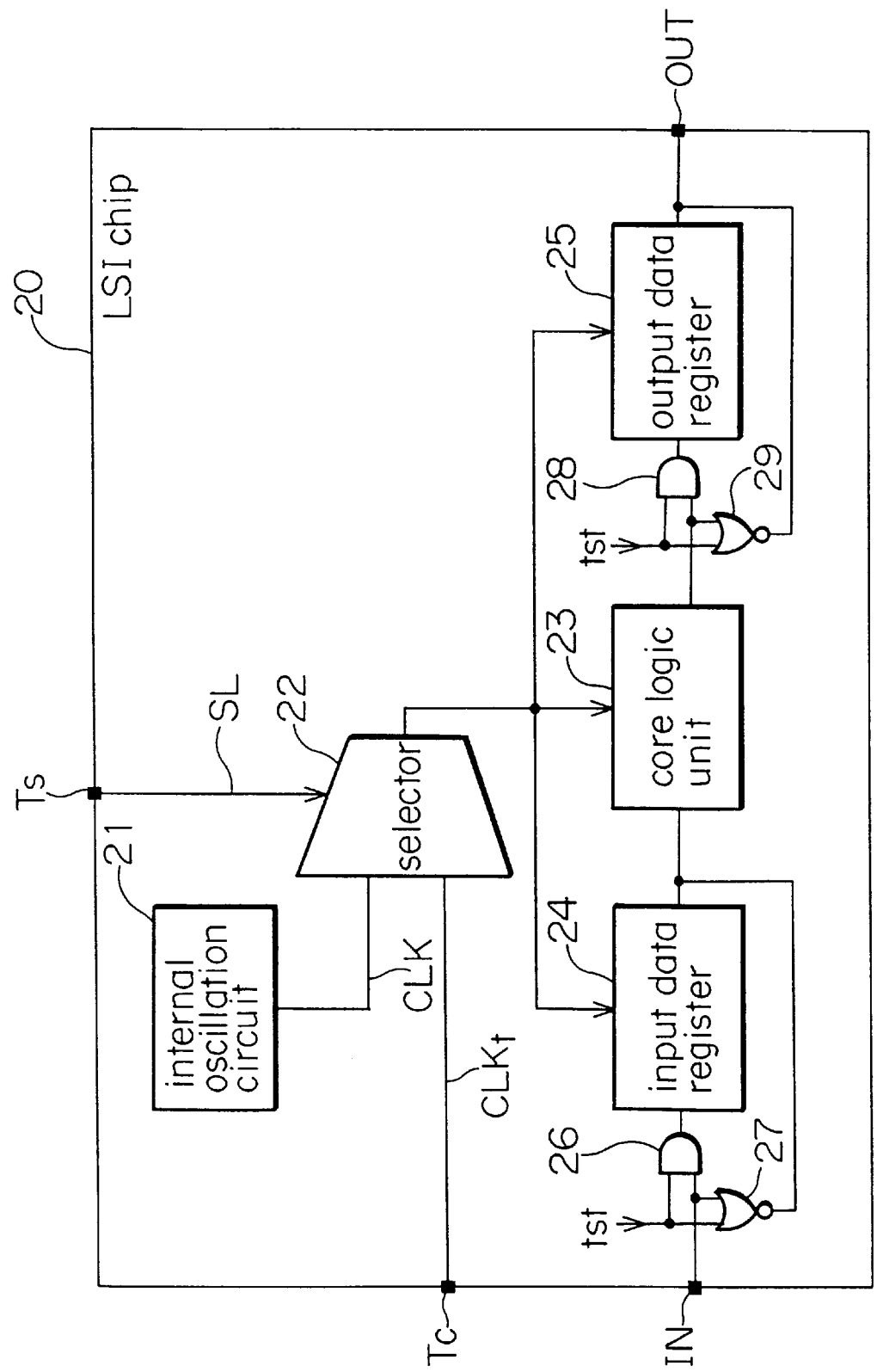
FIG. 1 is a block diagram of the LSI chip in a first embodiment of the present invention.
Figure 2:
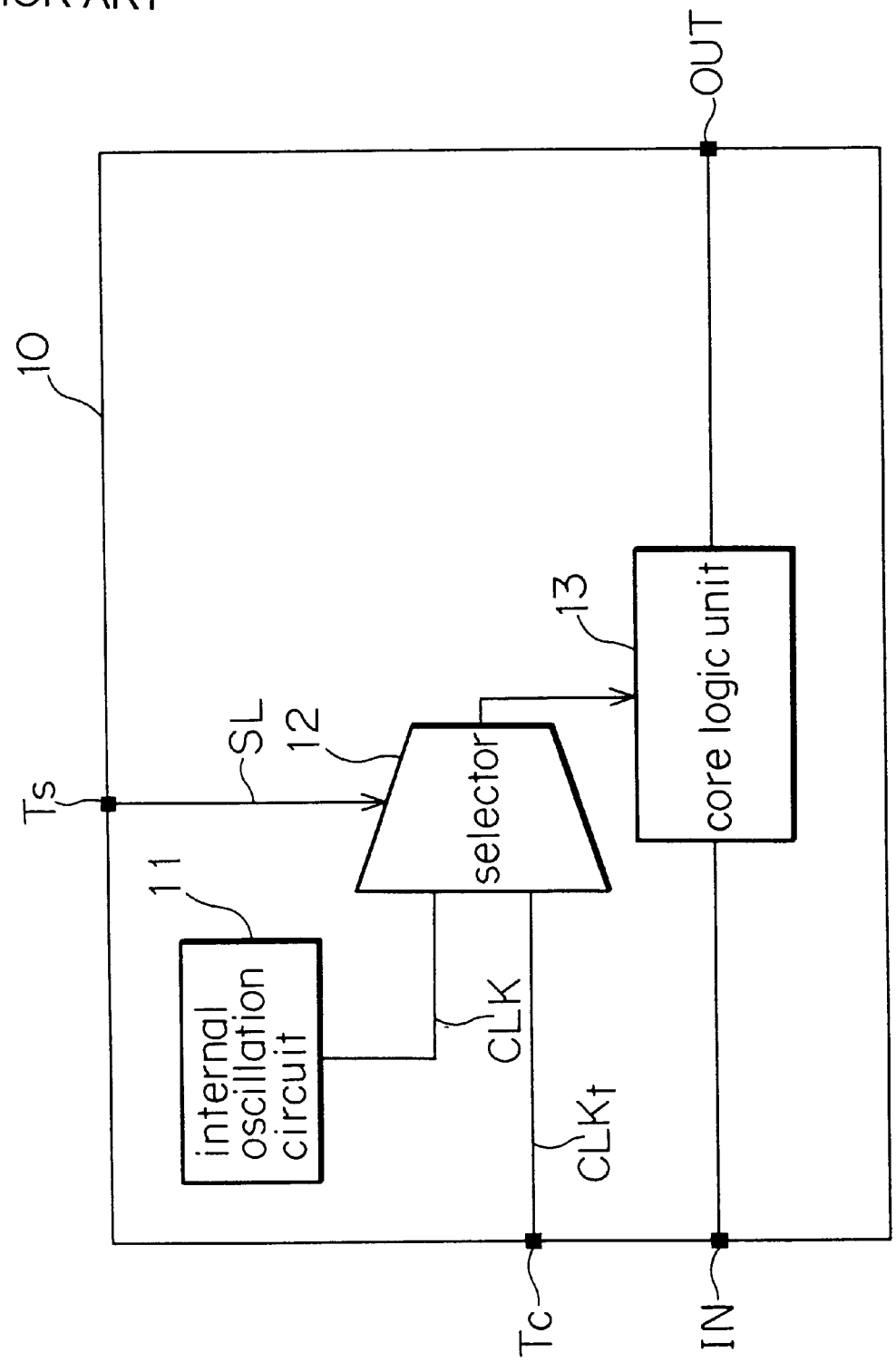
FIG. 2 is a block diagram illustrating an LSI chip in the prior art.

FIG. 1 is a block diagram of the LSI chip in the first embodiment of the present invention.

As in the prior art, an LSI chip 20 is provided with an internal oscillation circuit 21 that provides an internal clock CLK to the inside of the chip, a selector 22 and a core logic unit 23. However, unlike LSI chips in the prior art, the LSI chip 20 is provided with an input data register 24 and an output data register 25 each constituted of a RAM (random access memory) or the like.

The selector 22 selects and outputs either the internal clock CLK or a test clock CLKt input through a clock terminal Tc in conformance to a select signal SL input through a select terminal Ts. The core logic unit 23 takes in data in synchronization with the internal clock CLK or the test clock CLKt and outputs the results of processing achieved through an operation that is in synchronization with the clock.

An input terminal IN, through which data are input to the LSI chip 20, is connected to one of the input terminals of a 2-input AND gate 26 and one of the input terminals of a 2-input NOR gate 27. A signal tst for setting a test mode is input to the other input terminals of the AND gate 26 and the NOR gate 27. The output terminal of the NOR gate 27 is connected to the input side of the core logic unit 23, whereas the output terminal of the AND gate 26 is connected to the input side of the input data register 24.

The output side of the core logic unit 23 is connected to one of the input terminals of a 2-input AND gate 28 and one of the input terminals of a 2-input NOR gate 29. The signal tst is input to the other input terminals of the AND gate 28 and the NOR gate 29. The output terminal of the AND gate 28 is connected to the input side of the output data register 25. The output terminal of the NOR gate 29 is connected to an output terminal OUT of the chip 20. The clock selected by the selector 22 is also provided to the input data register 24 and the output data register 25.

Next, the operation performed by the LSI chip 20 when conducting a test using an LSI tester is explained.

Prior to the test, the signal tst is set to the valid "H" level. With this, the test mode is set. In the test mode, the AND gates 26 and 28 allow data provided through the input terminal IN and data output by the core logic unit 23 to pass through and the NOR gates 27 and 29 block these data.

Figure 3:
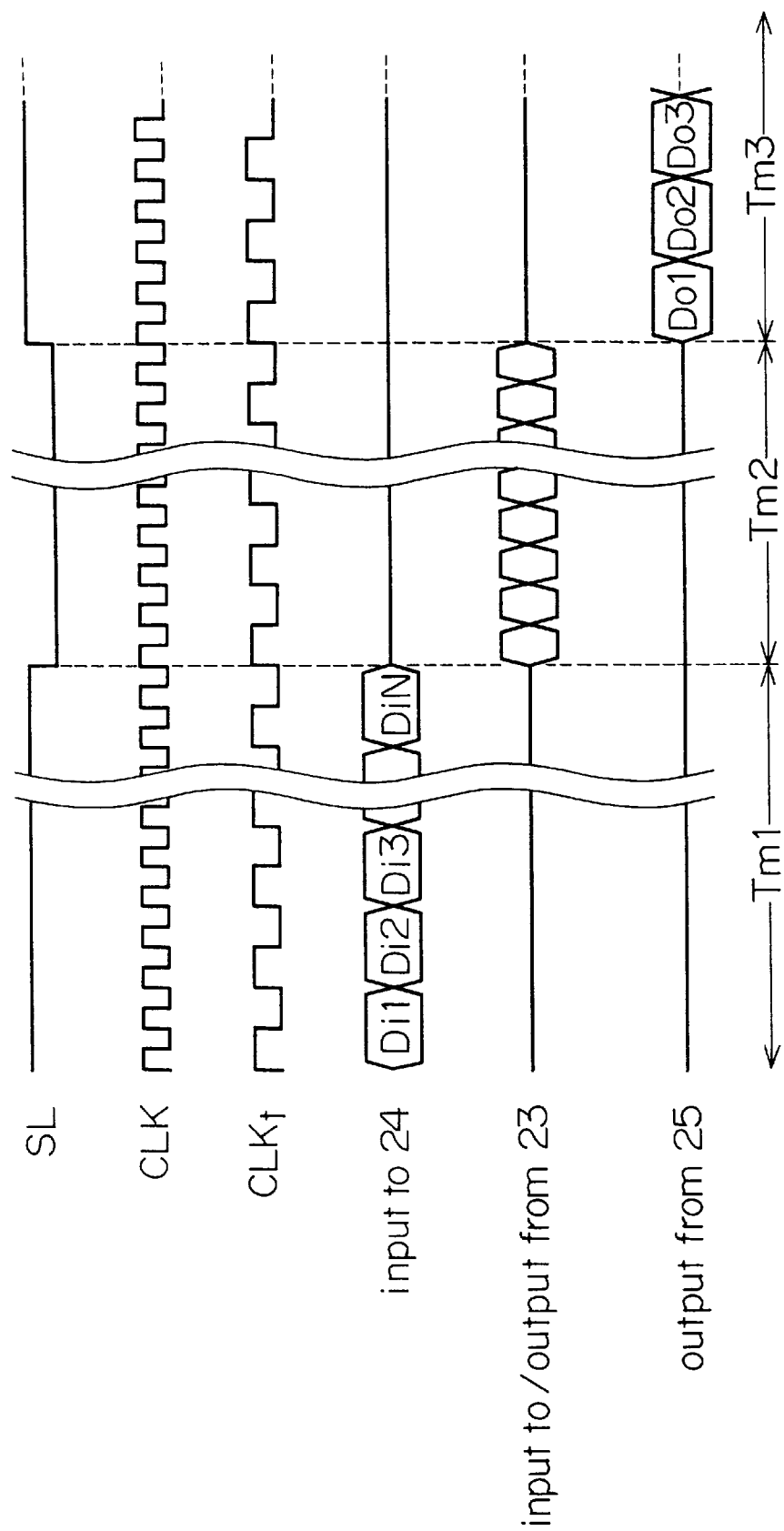
FIG. 3 is a timing chart of the operation performed by the LSI chip in FIG. 1 in the test mode.

FIG. 3 is a time chart of the operation performed by the LSI chip illustrated in FIG. 1 in the test mode.

As illustrated in FIG. 3, the period over which the test mode is set may be divided into a first period Tm1, a second period Tm2 and a third period Tm3. During the initial period Tm1, the select signal SL set to "H" is provided to the selector 22 so that the selector 22 selects the test clock CLKt. Test data Di1~DiN constituting a test pattern provided by the LSI tester via the input terminal IN and the AND gate 26 are input to the input data register 24 in synchronization with the clock CLKt, which is selected and output by the selector 22, and the input data register 24 stores the data. The operation enters the second period Tm2 by shifting the logic level of the select signal SL to "L" after all the test data Di1~DiN constituting the test pattern are stored.

During the second period Tm2, the selector 22 selects and outputs the internal clock CLK in conformance to the select signal SL set at "L", and the internal clock CLK is provided to the core logic unit 23, the input data register 24 and the output data register 25. This causes the core logic unit 23 to take in the data Di1~DiN stored in the input data register 24 in synchronization with the internal clock CLK and to generate output data Do1~DoN corresponding to the data Di1~DiN through an operation that is performed in synchronization with the internal clock CLK to be stored in the output data register 25. The operation enters the third period by resetting the logic level of the select signal SL to "H" after the output data Do1~DoN are stored in the output data register 25.

During the third period Tm3, the selector 22 selects and outputs the test clock CLKt in conformance to the select signal SL set to "H" and the test clock CLKt is provided to the core logic unit 23, the input data register 24 and the output data register 25. This causes the output data register 25 to sequentially output the stored output data Do1~DoN to the output terminal OUT in synchronization with the test clock CLKt. These output data Do1~DoN are input to the LSI tester, which then evaluates the LSI chip 20.

When the evaluation of the LSI chip 20 is completed, the signal tst is set to the invalid "L" level the operation shifts to a normal mode, The input data register 24 and the output data register 25 do not function in this state since the AND gates 26 and 28 block the data provided through the input terminal IN and the data output by the core logic unit 23 and the NOR gates 27 and 29 allow these data to pass through.

As described above, since the input data register 24 and the output data register 25 are provided in the first embodiment, it is possible to utilize the internal clock CLK, which is different from the test clock CLKt, to achieve an improvement in the accuracy of the evaluation. In addition, since the logic level of the select signal SL is changed and the core logic unit 23 is operated on the internal clock CLK during the period Tm2, it is possible to generate the output data Do1~DoN at a frequency exceeding the maximum frequency of the test clock CLKt to achieve a reduction in the length of time required for the evaluation of the LSI chip 20.

Second Embodiment

Figure 4:
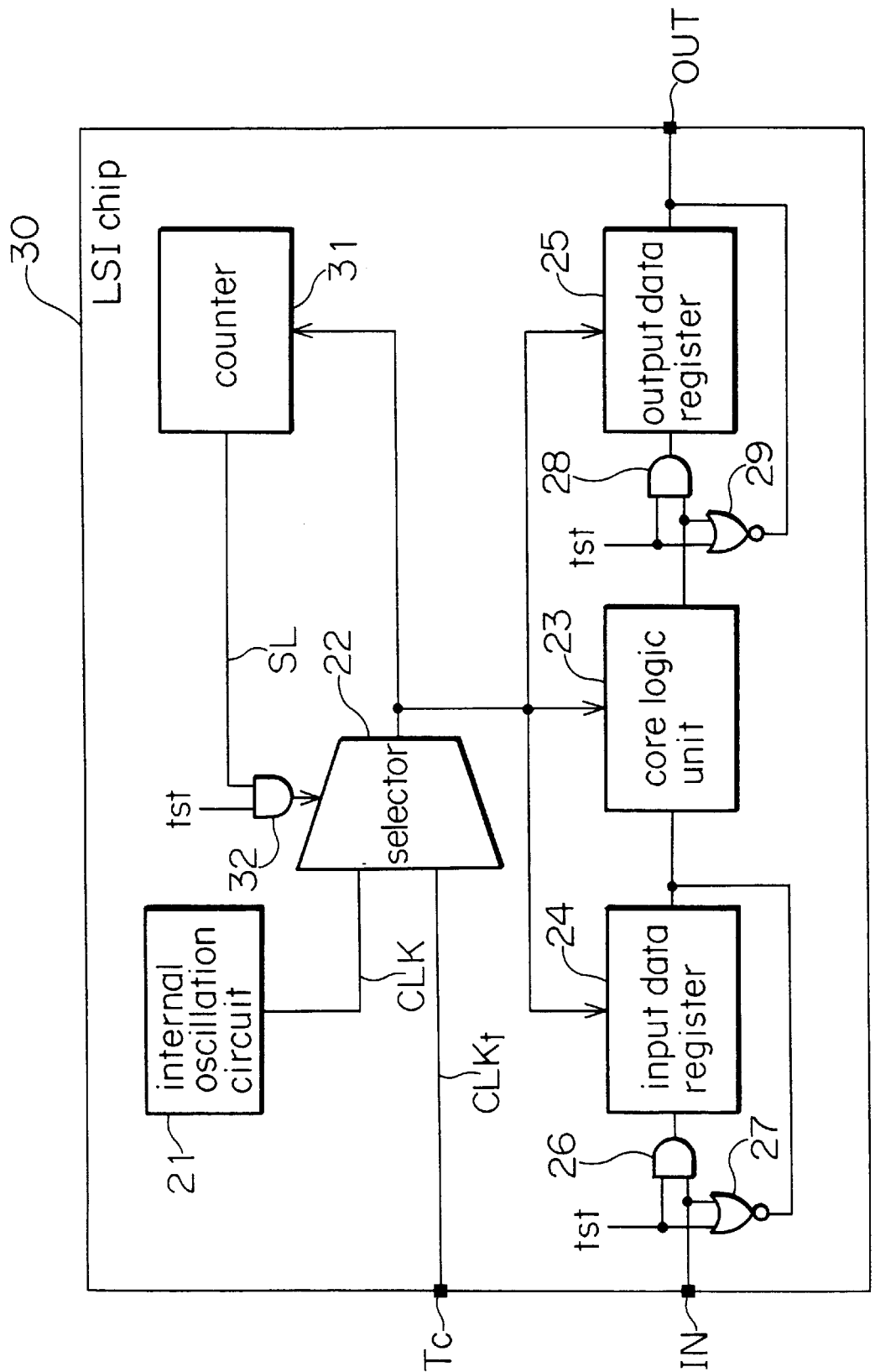
FIG. 4 is a block diagram of the LSI chip in a second embodiment of the present invention.

FIG. 4 is a block diagram of the LSI chip in the second embodiment of the present invention, with the same reference numbers assigned to elements identical to those in FIG. 1 illustrating the first embodiment.

This LSI chip 30 is characterized by a counter 31 provided to generate a select signal SL. The output terminal of the counter 31 is connected to one of the input terminals of a 2-input AND gate 32. A test signal tst for setting the test mode is input to the other input terminal of the AND gate 32, with the output terminal of the AND gate 32 connected to the selector 22. Apart from the counter 31 and the AND gate 32, the structural features of the chip 30 are identical to those in the first embodiment illustrated in FIG. 1. In addition, the output side of the selector 22 is connected to the counter 31.

Figure 5:
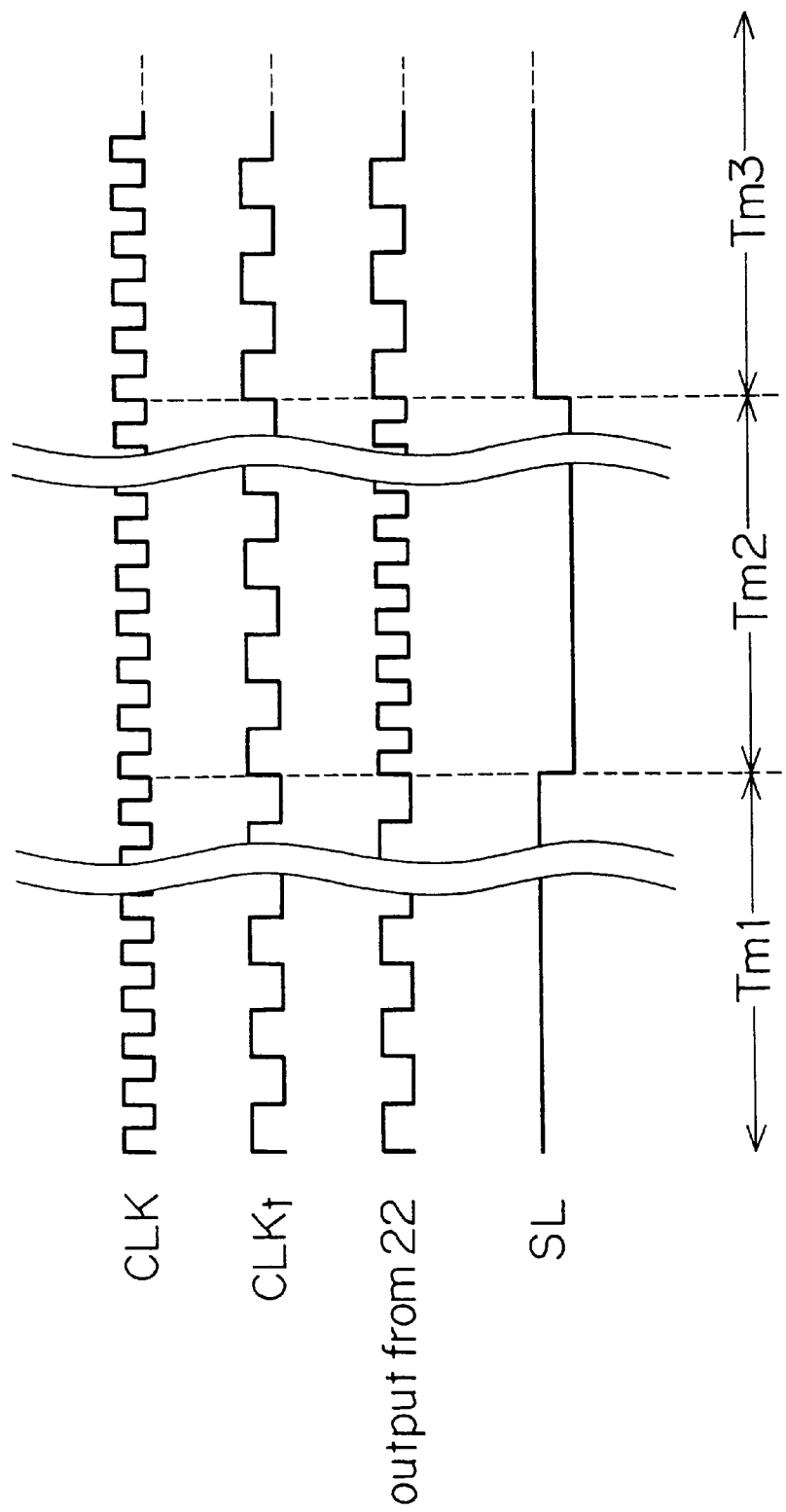
FIG. 5 is a timing chart of the operation performed by the counter 31 in FIG. 4.

FIG. 5 is a time chart illustrating the operation performed by the counter 31 in FIG. 4. Now, the operation of the LSI chip 30 is explained in reference to FIG. 5.

Prior to the test, the signal tst is set to the valid "H" level. With this, the test mode is set. In the test mode, the AND gates 26 and 28 allow data provided through the input terminal IN and data output by the core logic unit 23 to pass through and the NOR gates 27 and 29 block these data. In addition, while the test mode is set, the AND gate 32 allows the select signal SL output by the counter 31 to pass through to the selector 22.

The period over which the test mode is set. may be divided into a first period Tm1, a second period Tm2 and a third period Tm3, as in the first embodiment. During the initial period mil, the counter 31 provides the selector 22 with the select signal SL set to "H", which causes the test clock CLKt to be selected. The input data register 24 stores test data Di1~DiN input thereto via the input terminal IN and the AND gate 26 in synchronization with the clock CLKt selected and output by the selector 22. The counter 31 counts the number of pulses in the clock output by the selector 22, and inverts the logic level of the select signal SL when the count reaches a preset value. If the number of sets of test data Di1~DiN is smaller than the preset value, the logic level of the select signal SL is inverted to "L" after the test data Di1~DiN are stored and the operation shifts into the second period Tm2.

During the second period Tm2, in which the selector 22. selects and outputs the internal clock CLK in conformance to the logic level of the select signal SL, the core logic unit 23 and the output data register 25 engage in operations that are in synchronization with the internal clock CLK as in the first embodiment and the output data Do1~DoN are stored in the output data register 25. Since the counter 31 counts the number of pulses in the clock output by the selector 22 during the second period Tm2 as well, the logic level of the select signal SL is inverted to "H" again after the output data Do1~DoN are stored. With the logic level of the select signal SL switched to "H" the operation shifts to the third period Tm3.

During the third period Tm3, in which the selector 22 selects and outputs the test clock CLKt in conformance to the select signal SL, the output data register 25 sequentially outputs the stored output data Do1~DoN to the output terminal OUT in synchronization with the test clock CLKt as in the first embodiment. The output data Do1~DoN are then input to the LSI tester so that the LSI chip 30 can be evaluated.

When the evaluation of the LSI chip 30 is completed, the signal tst is set to the invalid "L" level and the operation shifts to normal mode. Since the AND gate 32 fixes the select signal SL input to the selector 22 at "L" in this state, the core logic unit 23 engages in an operation that is in synchronization with the internal clock CLK.

As explained above, the second embodiment, which is provided with the counter 31 that counts the number of pulses in the clock output by the selector 22 and inverts the logic. level of the select signal SL at the LSI chip 30 similar to the LSI chip in the fist embodiment, achieves advantages similar to those achieved in the first embodiment and, furthermore, eliminates the necessity for changing the select signal SL from the outside. Moreover, the select terminal Ts through which the select signal SL is received from the outside is no longer required.

Third Embodiment

Figure 6:
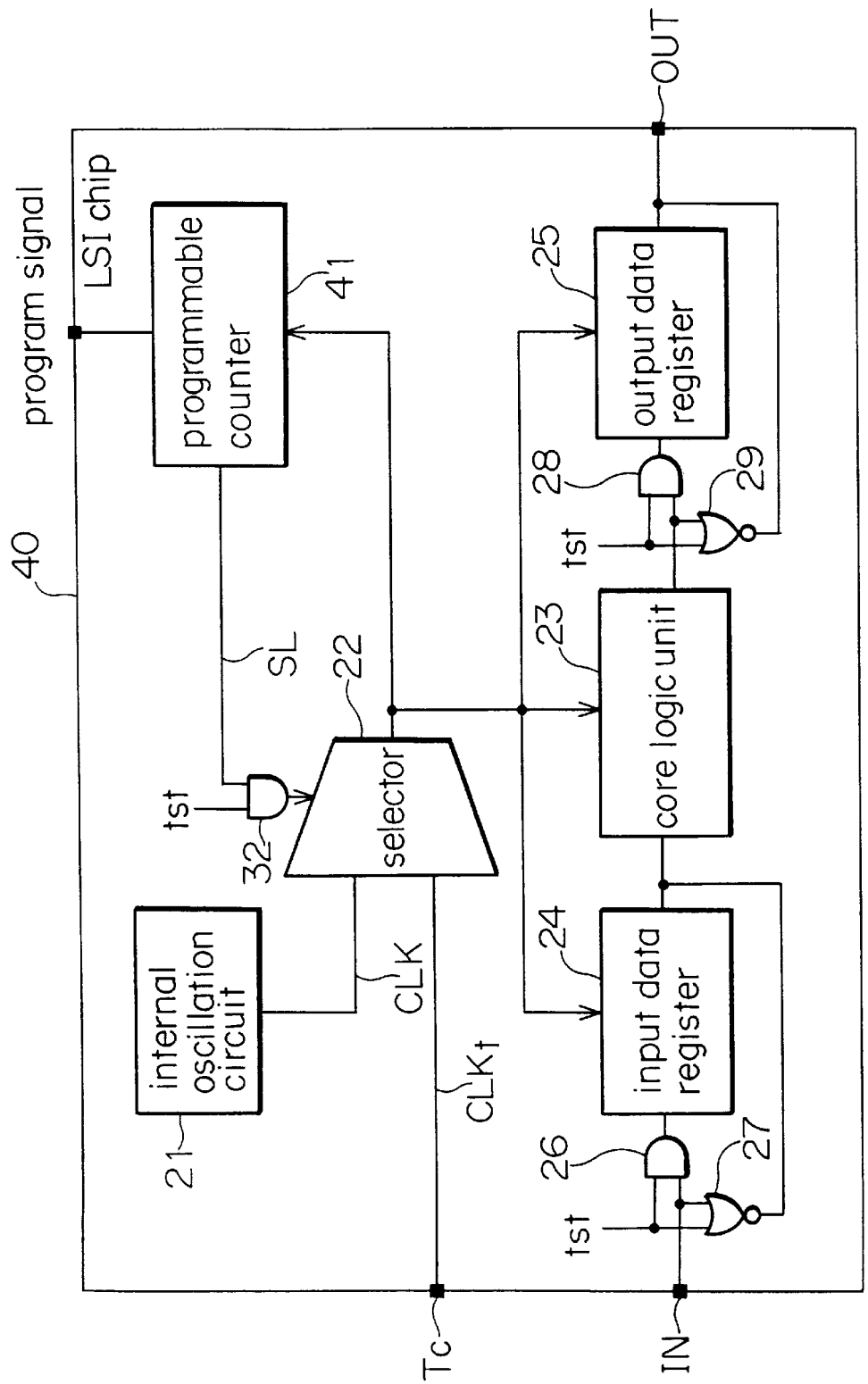
FIG. 6 is a block diagram of the LSI chip in a third embodiment of the present invention.

FIG. 6 is a block diagram of the LSI chip in the third embodiment of the present invention, with the same reference numbers assigned to elements identical to those in the second embodiment illustrated in FIG. 4.

This LSI chip 40, which is achieved by replacing the counter 31 in the second embodiment with a progammable counter 41 at which the maximum value setting for the count operation can be varied by a program signal provided from the outside, has identical structural features to those in FIG. 4 otherwise.

In the LSI chip 40 structured as described above, the programmable counter 41 counts the number of pulses in the clock selected by the selector 22 and when the results of the count exceed the maximum count value that has been set, the logic level of the select signal SL is inverted. Thus, the operation of the LSI chip 40 during a test is similar to that performed in the second embodiment.

Consequently, the third embodiment achieves advantages similar to those achieved in the first embodiment and furthermore eliminates the necessity for changing the select signal SL from the outside as in the second embodiment. Moreover, since the maximum count value that is set at the programmable counter 41 is variable, any restrictions imposed in regard to the number of steps in the test pattern are eliminated so that a test can be conducted in an efficient manner using a test pattern appropriate to the circuit scale.

Fourth Embodiment

Figure 7:
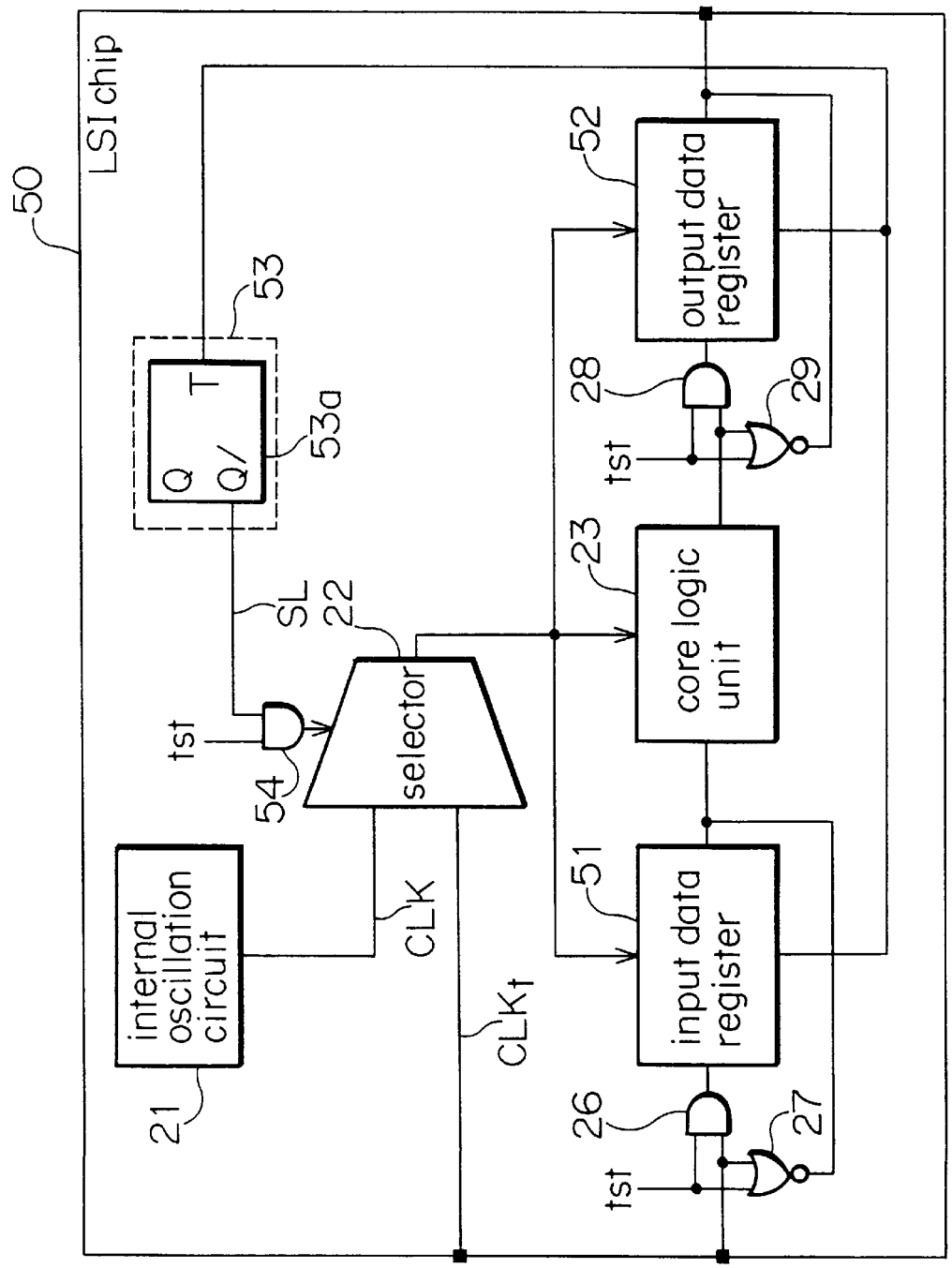
FIG. 7 is a block diagram of the LSI chip in a forth embodiment of the present invention.

FIG. 7 is a block diagram of the LSI chip in the fourth embodiment of the present invention, with the same reference numbers assigned to elements identical to those in the first embodiment illustrated in FIG. 1.

The LSI chip 50 is provided with an internal oscillation circuit 21, a selector 22 and a core logic unit 23 that are similar to those employed in the first embodiment. An input data register 51 constituted of an FIFO (first-in-first-out) memory is connected between the core logic unit 23 and the input terminal IN, and an output data register 52 constituted of a FIFO memory is connected between the core logic unit 23 and the output terminal OUT. The AND gates 26 and 28 and the NOR gates 27 and 29 are connected to the input/output data registers 51 and 52 in a manner similar to that illustrated in FIG. 1.

The input data register 51 has a function of generating a pulse when full all the data are stored, and the output data register 51 also has a function of generating a pulse when full. These pulses are input to a means for select signal generation 53. The means for select signal generation 53 may be constituted of, for instance, a toggle flipflop (hereafter referred to as a T-FF) 53a, which is connected in such a manner that it outputs a select signal SL set to "L" when a first pulse is input and outputs a select signal SL set to "H" when a second pulse is input. The output terminal Q/ of the T-FF 53a is connected to one of the input terminals of a 2-input AND gate 54. The signal tst for setting the test mode is input to the other input terminal of the AND gate 54, and the output tennmal of the AND gate 54 is connected to the selector 22.

Figure 8:
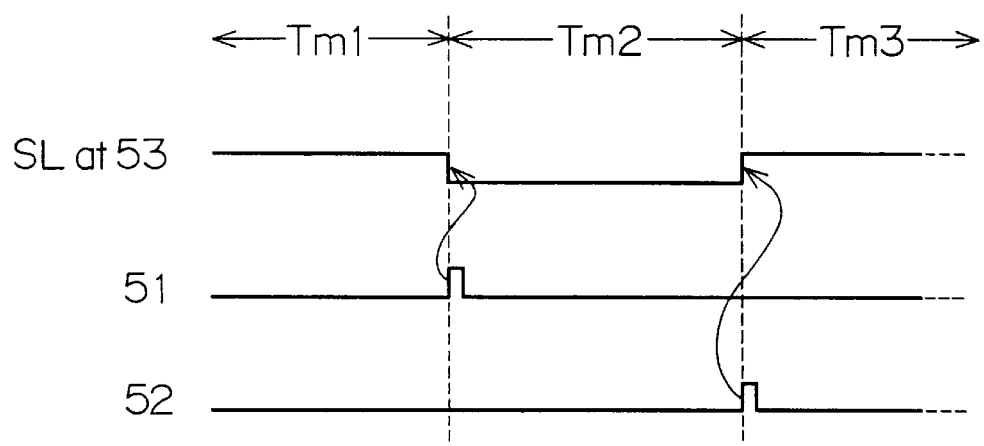
FIG. 8 is a timing chart of the operations performed by the registers 51 and 52 and the T-FF53a in FIG. 7.

FIG. 8 is a time chart illustrating the operations performed by the registers 51 and 52 and the T-FF 53a in FIG. 7. The operation performed by the LSI chip in FIG. 7 during a test is now explained in reference to FIG. 8.

Prior to the test, the signal tst is set to the valid "H" level. With this, the test mode is set. In the test mode, the AND gates 26 and 28 allow data provided through the input terminal IN and data output by the core logic unit 23 to pass through and the NOR gates 27 and 29 block these data. In addition, while the test mode is set, the AND gate 54 allows the select signal SL output by the T-FF 53a to pass through to the selector 22.

The period over which the test mode is set may be divided into a first period Tm1, a second period Tm2 and a third period Tm3, as in the first embodiment. During the initial period Tm1, the T-FF 53a provides the selector 22 with the select signal SL set to "H", which causes the test clock CLKt to be selected. The input data register 51 stores test data Di1~DiN input thereto via the input terminal IN and the AND gate 26 in synchronization with the clock CLKt selected and output by the selector 22.

When all the test data Di1~DiN are stored, the input data register 51 enters a data-full state and outputs a pulse as illustrated in FIG. 8. This pulse is provided to a toggle terminal T of the T-FF 53a so that the T-FF 53a outputs the select signal SL set to "L". This shifts the operation into the second period Tm2.

During the second period Tm2, in which the selector 22 selects and outputs the internal clock CLK in conformance to the select signal SL set to "L", the core logic unit 23 and the output data register 52 engage in operations that are in synchronization with the internal clock CLK as in the first embodiment, and the output data Do1~DoN are stored in the output data register 52. The output data register 52 having all the output data Do1~DoN stored therein enters a data-full state and outputs a pulse. This pulse is provided to the toggle terminal T of the T-FF 53a so that the T-FF 53a outputs the select signal SL set to "H". This shifts the operation into the third period Tm3.

During the third period Tm3, in which the selector 22 selects and outputs the test clock CLKt in conformance to the select signal SL, the output data register 52 sequentially outputs the stored output data Do1~DoN to the output terminal OUT in synchronization with the test clock CLKt as in the first embodiment. The output data Do1~DoN are then input to the LSI tester so that the LSI chip 50 can be evaluated.

When the evaluation of the LSI chip 50 is completed, the signal tst is set to the invalid "L" level and the operation shifts to normal mode. Since the AND gate 54 fixes the select signal SL input to the selector 22 at "L" in this state, the core logic unit 23 engages in an operation. that is in synchronization with the internal clock CLK.

As explained above, the fourth embodiment, which is provided with the input data register 51 that outputs a pulse when the test data Di1~DiN constituting a test pattern are stored therein, the output data register 52 that outputs a pulse when the output data Do1~DoN are stored therein and the T-FF 53a that inverts the logic level of the select signal SL using the pulses output by these registers, achieves advantages similar to those achieved in the first embodiment. In addition, since the select signal SL is generated inside the chip, unlike in the first and third embodiments, the external terminal becomes redundant and it can be, therefore, eliminated. Furthermore, since the counter 31 is not employed, the circuit scale is reduced.

It is to be noted that the present invention is not limited to the embodiments explained above and a number of variations are possible.

For instance, the AND gate 26 and the NOR gate 27 on the input sides of the input data registers 24 and 51 may be constituted through a combination of other gates. The AND gate 28 and the NOR gate 29 on the input sides of the output data registers 25 and 52 may be constituted through a combination of other gates. In addition, the T-FF 53a may be constituted of a 1-bit counter or the like.

As has been explained, in the first aspect of the present invention, which is provided with the input data register connected between the input terminal and the core logic unit to store test data in synchronization with the test clock output by the selector during the first period and the output data register connected between the core logic unit and the output terminal to store output data output by the core logic unit in synchronization with the internal clock output by the selector during the second period to provide the stored output data to the output terminal in synchronization with the test clock output by the selector during the third period, it is possible to input/output data to/from the LSI in synchronization with the test clock and to operate the core logic unit on the internal clock. Consequently, tests can be conducted without any restrictions imposed by the frequency of the test clock. In addition, the accuracy of the evaluation of the LSI is improved.

In the second and third aspects of the present invention, since the counter or the programmable counter is provided, the logic level of the select signal is inverted automatically to eliminate the necessity for changing the logic level of the select signal from the outside.

According to the fourth embodiment, which adopts a structure in which a pulse is output when a specific number of sets of data is input to the input data register or the output data register and the means for select signal generation to generate a select signal based upon the pulse is provided, it is no longer necessary to change the logic level of the select signal from the outside.

The entire disclosure of Japanese Patent Application No. 10-252487 filed on Sep. 7, 1998 including specification, claims, drawings and summary is incorporated herein by reference in its entirety.

What is claimed is:

1. A semiconductor integrated device comprising:
    an internal oscillation circuit that generates an internal clock through oscillation;
    a selector that selects either a test clock provided from the outside or said internal clock based upon a select signal;
    a core logic unit that takes in input data input through an input terminal in synchronization with said test clock or said internal clock provided by said selector, performs processing on said input data and outputs output data resulting from said processing to an output terminal;
    an input data register connected between said input terminal and said core logic unit, that stores therein test data provided via said input terminal as said input data in synchronization with said test clock output by said selector during a first period elapsing after a test mode is set; and
    an output data register connected between said core logic unit and said output terminal, that stores therein said output data output by said core logic unit in synchronization with said internal clock output by said selector during a second period following said first period and provides said output data which have been stored to said output terminal in synchronization with said test clock output by said selector during a third period starting after said second period is completed.

2. A semiconductor integrated device according to claim 1, further comprising:
    a counter that counts the number of clock pulses in said internal clock or said test clock output by said selector and generates said select signal whose logic level changes each time the count reaches a specific value.

3. A semiconductor integrated device according to claim 2, wherein:
    said counter is a programmable counter at which said specific value is variable.

4. A semiconductor integrated device according to claim 1, wherein:
    said input data register and said output data register each output a pulse when a specific number of sets of data are input thereto; and a means for select signal generation that generates said select signal which causes said selector to select said test clock during said first period, causes said selector to select said internal clock in conformance to said pulse output by said input data register when said specific number of sets of test data are input to said input data register and causes said selector to select said test clock in conformance to said pulse output by said output data register when said specific number of sets of output data are input to said output data register is provided.

* * * * *